United States Patent
Park et al.

(10) Patent No.: US 6,897,106 B2
(45) Date of Patent: May 24, 2005

(54) CAPACITOR OF SEMICONDUCTOR MEMORY DEVICE THAT HAS COMPOSITE $AL_2O_3/HFO_2$ DIELECTRIC LAYER AND METHOD OF MANUFACTURING THE SAME

(75) Inventors: Ki-Yeon Park, Kyungki-do (KR); Sung-Tae Kim, Seoul (KR); Young-Sun Kim, Kyungki-do (KR); In-Sung Park, Seoul (KR); Jae-Hyun Yeo, Seoul (KR); Ki-Vin Im, Kyungki-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/713,577

(22) Filed: Nov. 12, 2003

(65) Prior Publication Data

US 2004/0157391 A1 Aug. 12, 2004

Related U.S. Application Data

(63) Continuation-in-part of application No. 10/452,979, filed on Jun. 2, 2003.

(30) Foreign Application Priority Data

Aug. 16, 2002 (KR) .......................... 2002-48404
Nov. 12, 2002 (KR) .............................. 10-2002-0069997

(51) Int. Cl.[7] .......................................... H01L 21/8242
(52) U.S. Cl. ....................................... 438/240
(58) Field of Search .................... 438/240, 3, 386, 438/396, 680, 681, 663

(56) References Cited

U.S. PATENT DOCUMENTS

| | | |
|---|---|---|
| 5,440,157 A | 8/1995 | Imai et al. |
| 5,641,702 A | 6/1997 | Imai et al. |
| 6,287,965 B1 | 9/2001 | Kang et al. |
| 6,399,491 B2 | 6/2002 | Jeon et al. |
| 6,596,583 B2 | 7/2003 | Agarwal et al. |
| 6,599,794 B2 | 7/2003 | Kiyotoshi et al. |
| 6,617,639 B1 * | 9/2003 | Wang et al. ............. 257/324 |
| 6,660,631 B1 | 12/2003 | Marsh |
| 6,660,660 B2 | 12/2003 | Kaukka et al. |
| 6,674,138 B1 * | 1/2004 | Halliyal et al. ........ 257/411 |
| 6,682,973 B1 * | 1/2004 | Paton et al. ............ 438/240 |
| 6,693,004 B1 * | 2/2004 | Halliyal et al. ........ 438/240 |
| 6,703,277 B1 * | 3/2004 | Paton et al. ............ 438/287 |
| 2001/0024387 A1 | 9/2001 | Raaijmakers et al. |
| 2002/0115252 A1 | 8/2002 | Haukka et al. |

FOREIGN PATENT DOCUMENTS

| | | |
|---|---|---|
| KR | P2001-0082118 | 8/2001 |
| KR | P2002-0002596 | 1/2002 |
| KR | P2002-0034520 | 5/2002 |

OTHER PUBLICATIONS

English Language Abstract of Korean Publication No: P2001-0082118.
English Language Abstract of Korean Publication No: P2002-0002596.
English Language Abstract of Korean Publication No: P2002-0034520.

* cited by examiner

*Primary Examiner*—David Nhu
(74) *Attorney, Agent, or Firm*—Marger Johnson & McCollom P.C.

(57) ABSTRACT

A semiconductor memory device that includes a composite $Al_2O_3/HfO_2$ dielectric layer with a layer thickness ratio greater than or equal to 1, and a method of manufacturing the capacitor are provided. The capacitor includes a lower electrode, a composite dielectric layer including an $Al_2O_3$ dielectric layer and an $HfO_2$ dielectric layer sequentially formed on the lower electrode, the $Al_2O_3$ dielectric layer having a thickness greater than or equal to the $HfO_2$ dielectric layer, and an upper electrode formed on the composite dielectric layer. The $Al_2O_3$ dielectric layer has a thickness of 30–60 Å. The $HfO_2$ dielectric layer has a thickness of 40 Å or less.

12 Claims, 11 Drawing Sheets

FIG. 3

[Toxeq(Å)]

| Al₂O₃ THICKNESS(Å) | 10 | 20 | 30 | 40 | 50 | 60 | HfO₂ THICKNESS(Å) |
|---|---|---|---|---|---|---|---|
| 10 | 15.2 | 15.9 | 16.5 | 17.2 | 17.8 | 18.5 | |
| 15 | 17.5 | 18.2 | 18.8 | 19.5 | 20.1 | 20.8 | |
| 20 | 19.8 | 20.5 | 21.1 | 21.8 | 22.4 | 23.1 | |
| 25 | 22.1 | 22.8 | 23.4 | 24.1 | 24.7 | 25.4 | |
| 27.5 | 23.3 | 23.9 | 24.6 | 25.2 | 25.9 | 26.5 | |
| 30 | 24.4 | 25.1 | 25.7 | 26.4 | 27.0 | 27.7 | |
| 32.5 | 25.6 | 26.2 | 26.9 | 27.5 | 28.2 | 28.8 | |
| 35 | 26.7 | 27.4 | 28.0 | 28.5 | 29.3 | 30.0 | |
| 40 | 29.0 | 29.7 | 30.3 | 31.0 | 31.6 | 32.3 | |
| | | NORMAL LEAKAGE CURRENT | | | | LEAKAGE CURRENT DETERIORATION | SiON = 10Å | ns

CAPACITOR OF SEMICONDUCTOR MEMORY DEVICE THAT HAS COMPOSITE AL₂O₃/HFO₂ DIELECTRIC LAYER AND METHOD OF MANUFACTURING THE SAME

This application claims priority from Korean Patent Application No. 2002-69997, filed on Nov. 12, 2002, in the Korean Intellectual Property Office, the disclosure of which is incorporated herein in its entirety by reference. Also, this application is a Continuation-In-Part (C.I.P.) of application Ser. No. 10/452,979, filed on Jun. 2, 2003.

BACKGROUND OF THE INVENTION

1. Field of the Invention

The present invention relates generally to integrated circuits and a method of manufacturing the same, and more particularly, to a semiconductor device that has a dielectric structure capable of enhancing electrical characteristics, and a method of manufacturing the same.

2. Description of the Related Art

The increasing integration density of semiconductor devices needs a capacitor of a DRAM having greater capacitance per unit area. To meet this requirement, a variety of methods have been introduced. Such methods include a method of increasing the electrode surface area of the capacitor by forming a three-dimensional stacked, cylindrical, or trench type electrode or by forming hemispherical grains on the electrode surface, a method of thinning a dielectric layer, a method of forming the dielectric layer using of high-dielectric material having a high dielectric constant or a ferroelectric material and so on. However, the above methods are not without their limitations. For example, reducing the thickness of the dielectric layer seriously increases leakage current as the capacitance increases. When a material having a high dielectric constant, for example, $Ta_2O_5$ or $BST((Ba,Sr)TiO_3)$, is used for the dielectric layer, polysilicon, which has been conventionally used to form the electrode, cannot be used. This is because the use of the polysilicon causes tunneling and increases leakage current when the thickness of the dielectric layer is reduced.

As another method for increasing capacitance per unit area of the capacitor, a metal-insulator-metal (MIM) capacitor whose electrode is formed of, instead of polysilicon, a metal having a large work function, such as TiN or Pt, has been suggested. In this method, the growth of a native oxide layer on the metal electrode is suppressed to prevent a capacitance reduction by a low-dielectric oxide layer. In the MIM capacitor, an oxide of a metal having a great affinity for oxygen is mostly used for a dielectric layer.

Recently, in order to resolve problems caused by increase in leakage current with reduced thickness of the dielectric layer, forming a composite dielectric layer, which includes a conventional dielectric layer and a higher dielectric constant layer, instead of a single dielectric layer, has been suggested. The formation of the composite dielectric layer prevents leakage current from increasing due to the use of the higher dielectric constant layer, without reducing capacitance, and improves the electrical properties of the capacitor.

a needs still exists for Particularly, a great deal of research has been conducted into a dual or multi-dielectric layer including a $Al_2O_3$ layer, which has a small dielectric constant of about 10 but effectively prevents leakage current, and an $HfO_2$ layer, which has a large dielectric constant of 20–25 and effectively prevents leakage current due to its large band gap.

SUMMARY OF THE INVENTION

The present invention provides a capacitor of a highly integrated semiconductor memory device that includes a composite $Al_2O_3/HfO_2$ dielectric layer with a layer thickness ratio that is optimized for maximum suppression of leakage current.

The present invention also provides a method of manufacturing a capacitor of a semiconductor memory device that includes a composite $Al_2O_3/HfO_2$ dielectric layer with a layer thickness ratio that is optimized for maximum suppression of leakage current. According to an aspect of the present invention, there is provided capacitor of a semiconductor memory device, the capacitor comprising: a lower electrode; a composite dielectric layer including an $Al_2O_3$ dielectric layer and an $HfO_2$ dielectric layer sequentially formed on the lower electrode, the $Al_2O_3$ dielectric layer having a thickness greater than or equal to the $HfO_2$ dielectric layer; and an upper electrode formed on the composite dielectric layer.

According to specific embodiments of the capacitor, the $Al_2O_3$ dielectric layer may have a thickness of 30–60 Å. The $HfO_2$ dielectric layer may have a thickness of 40 Å or less, for example, 10–40 Å. The lower electrode is made of one of polysilicon, metal nitride, and noble metal. Preferably, the lower electrode is made of one selected from the group consisting of TiN, TaN, WN, Ru, Ir, Pt, and a composite layer of the forgoing materials. When the lower electrode is made of polysilicon, the capacitor according to the present invention may further includes a silicon nitride layer between the lower electrode and the composite dielectric layer.

The upper electrode may be made of one of polysilicon, metal nitride, and noble metal. Preferably, the upper electrode is made of one selected from the group consisting of TiN, TaN, WN, Ru, Ir, Pt, and a composite layer of the forgoing materials.

An alternative capacitor according to the present invention includes: a lower electrode made of one of metal nitride and noble metal; an upper electrode made of one of metal nitride and noble metal; a composite dielectric layer, formed between the lower electrode and the upper electrode, that includes an $Al_2O_3$ dielectric layer and an $HfO_2$ dielectric layer with a thickness ratio of $Al_2O_3$ to $HfO_2$ that is greater than or equal to 1.

According to another aspect of the present invention, there is provided a method of manufacturing a capacitor of a semiconductor memory device, the method including forming a lower electrode on a semiconductor substrate. Next, a composite dielectric layer is formed on the lower electrode, wherein the composite dielectric layer includes an $Al_2O_3$ dielectric layer having a first thickness and an $HfO_2$ dielectric layer having a second thickness, the second thickness being smaller than or equal to the first thickness. An upper electrode is formed on the composite dielectric layer.

According to specific embodiments of the capacitor manufacturing method, each of the $Al_2O_3$ dielectric layer and the $HfO_2$ dielectric layer may be formed using one of chemical vapor deposition and atomic layer deposition. The method may further include thermally treating the composite dielectric layer. In which case, thermally treating the composite dielectric layer is performed in a vacuum, in an oxygen atmosphere, in an inert gas atmosphere by rapid thermal annealing, by furnace annealing, plasma annealing, or UV annealing.

Since a capacitor of a semiconductor memory device according to the present invention has a composite $Al_2O_3$/

HfO$_2$ dielectric layer with a thickness ratio of Al$_2$O$_3$ to HfO$_2$ that is greater than or equal to 1, the leakage current characteristics of the capacitor are improved. With the capacitor according to the present invention that includes the composite Al$_2$O$_3$/HfO$_2$ dielectric layer with optimal thickness ratio between the two dielectric layers, the effect of suppressing increase in leakage current is maximized and superior electrical properties are obtained.

BRIEF DESCRIPTION OF THE DRAWINGS

The above objects and advantages of the present invention will become more apparent by describing in detail exemplary embodiments thereof with reference to the attached drawings in which:

FIG. 3 is a table of leakage current characteristics for capacitors with various composite Al$_2$O$_3$/HfO$_2$ dielectric layers having different thickness ratios of the Al$_2$O$_3$ dielectric layer to the HfO$_2$ dielectric layer;

DETAILED DESCRIPTION OF THE INVENTION

Figure 1A:
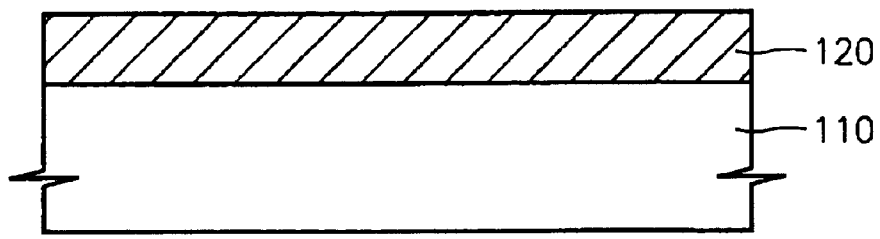
FIGS. 1A through 1E are sectional views illustrating step by step a method of manufacturing a capacitor of a semiconductor memory device according to an embodiment of the present invention.

Exemplary embodiments of the present invention described below may be varied in many different forms, and the scope of the present invention is not limited to the following embodiments; rather, these embodiments are provided so that this disclosure will be thorough and complete, and will fully convey the concept of the invention to those skilled in the art. In the drawings, the thickness of layers and regions are exaggerated for clarity.

FIGS. 1A through 1D are sectional views illustrating step-by-step a method of manufacturing a capacitor of a semiconductor memory device according to an embodiment of the present invention. Referring to FIG. 1A, a lower electrode 120 is formed on a semiconductor substrate 110 to a thickness of tens to hundreds of angstroms. The lower electrode 120 may be formed of polysilicon, a metal nitride, or a noble metal. For example, the lower electrode 120 may be formed of a single layer of doped polysilicon, TiN, TaN, WN, Ru, Ir, or Pt, or a composite layer of these materials. When the lower electrode 120 is formed of doped polysilicon, a silicon nitride layer (not shown) is formed on the surface of the lower electrode 120 through rapid thermal nitridation (RTN) so as to prevent the lower electrode 20 from being oxidized during a subsequent thermal process.

Figure 1B:
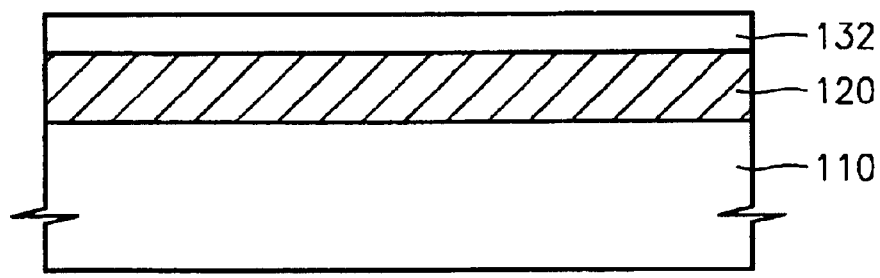

Referring to FIG. 1B, a Al$_2$O$_3$ dielectric layer 132 is formed on the lower electrode 120 to a thickness of about 20–60 Å, preferably, about 30–60 Å. The Al$_2$O$_3$ dielectric layer 132 is formed to be thicker than or of equal thickness to an HfO$_2$ dielectric layer 134 (refer to FIG. 1C). The reason for this will be described later.

The Al$_2$O$_3$ dielectric layer 132 may be formed using chemical vapor deposition (CVD) or atomic layer deposition (ALD). When the Al$_2$O$_3$ dielectric layer 132 is formed using ALD, sequential deposition processes are carried out with trimethylaluminum (TMA) as a first reactant and O$_3$ as a second reactant, at a temperature of 200–500° C. and a pressure of 0.1–5 torr. The deposition and purging processes are repeated until the Al$_2$O$_3$ dielectric layer 132 having a desired thickness is obtained. In addition to TMA, other examples of a first reactant for forming the Al$_2$O$_3$ dielectric layer 132 include AlCl$_3$, AlH$_3$N(CH$_3$)$_3$, C$_6$H$_{15}$AlO, (C$_4$H$_9$)$_2$AlH, (CH$_3$)$_2$AlCl, (C$_2$H$_5$)$_3$Al, (C$_4$H$_9$)$_3$Al, and the like. Other examples of a second reactant for forming the Al$_2$O$_3$ dielectric layer 132 include activated oxidizing agents, such as H$_2$O, H$_2$O$_2$, plasma N$_2$O, plasma O$_2$, and the like. When the Al$_2$O$_3$ dielectric layer 132 is formed using O$_3$ as the second reactant, the Al2O3 dielectric layer 132 has a similar dielectric constant and leakage current characteristics but is more reliable, compared to the case of using H$_2$O as the second reactant.

Figure 1C:
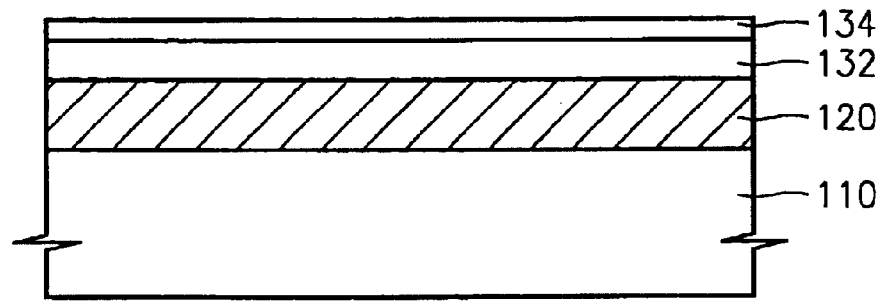

Referring to FIG. 1C, an HfO$_2$ dielectric layer 134 is formed on the Al$_2$O$_3$ dielectric layer 132. As a result, a composite Al$_2$O$_3$/HfO$_2$ dielectric layer is formed. The HfO$_2$ dielectric layer 134 has a thickness greater than or equal to the Al$_2$O$_3$ dielectric layer 132. The HfO$_2$ dielectric layer 134 has, preferably, a thickness of 40 Å or less, more preferably, 10–40 Å.

The HfO$_2$ dielectric layer 134 may be formed using CVD or ALD. When the HfO$_2$ dielectric layer 134 is formed using CVD, deposition is carried out with an Hf source material and O$_2$ gas at a temperature of about 400–500° C. and a pressure of about 1–5 torr. Examples of the Hf source material include $HfCl_4$, $Hf(OtBu)_4$, $Hf(NEtMe)_4$, $Hf(MMP)_4$, $Hf(NEt_2)_4$, $Hf(NMe_2)_4$, and the like.

When the $HfO_2$ dielectric layer 134 is formed using ALD, deposition is carried out with a metal organic precursor as an Hf source and $H_2O$, $H_2O_2$, alcohols containing an —OH radical, or $O_3$ or $O_2$ plasma, as an oxygen source, at a temperature of about 150–500° C. and a pressure of about 0.1–5 torr. Examples of the Hf source include $HfCl_4$ and metal organic precursors, such as $Hf(OtBu)_4$, $Hf(NEtMe)_4$, $Hf(MMP)_4$, $Hf(NEt_2)_4$, and $Hf(NMe_2)_4$. The deposition and purging processes are repeated until the $HfO_2$ dielectric layer 134 having a desired thickness is obtained. When ALD is applied to form the $HfO_2$ dielectric layer 134, low-temperature deposition, effective step coverage, and easy thickness control are ensured. The $HfO_2$ dielectric layer 134 manufactured through either of the above-described methods has good leakage current characteristics and high reliability.

Figure 1D:
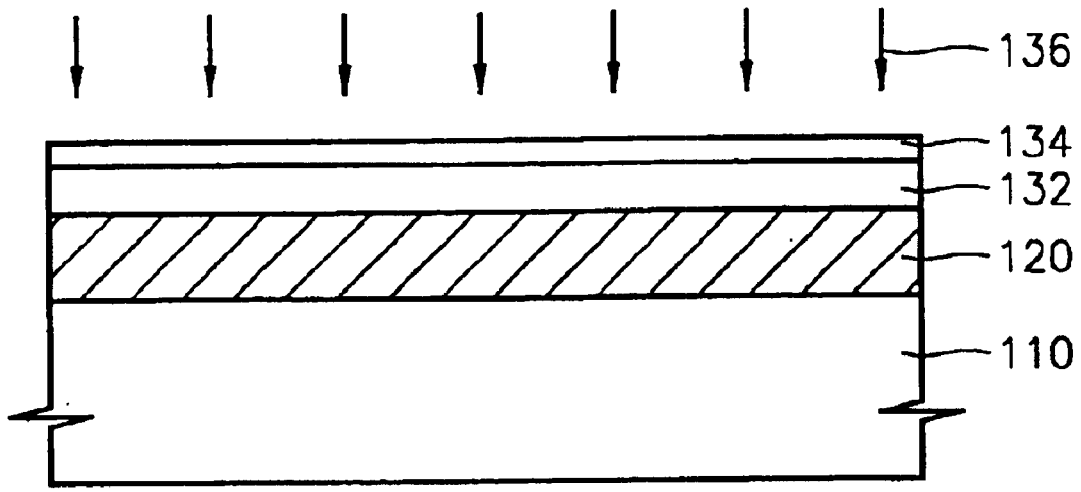

Referring to FIG. 1D, the $HfO_2$ dielectric layer 134 is thermally treated, as indicated by reference numeral 136. This thermal treatment 136 is performed to perfect stochiometry which is imperfect due to insufficient oxygen when the layer is grown rapidly for mass production, to repair defects occurring during the deposition, and to transition to crystalline state for a high dielectric constant. Further, through the thermal treatment 136, impurities can be removed from the $HfO_2$ dielectric layer 134, and the density of the $HfO_2$ dielectric layer 134 can be increased. The thermal treatment 136 may also have a curing effect.

Examples of the thermal treatment 136 includes thermal treatment in a vacuum, thermal treatment in an oxygen atmosphere, rapid thermal annealing in an oxygen or inert gas atmosphere, furnace annealing, plasma annealing, UV annealing, and the like. Examples of oxygen gas for RTA include $O_2$, $N_2O$, and the like, and examples of inert gas for RTA include $N_2$, Ar, and the like. The thermal treatment 136 may be followed by additional thermal treatment in an $O_3$ or $O_2$ plasma atmosphere if required. Alternatively, additional thermal treatment may be performed before the thermal treatment 136. Both the thermal treatment 136 and additional treatment may be omitted if required.

Figure 1E:
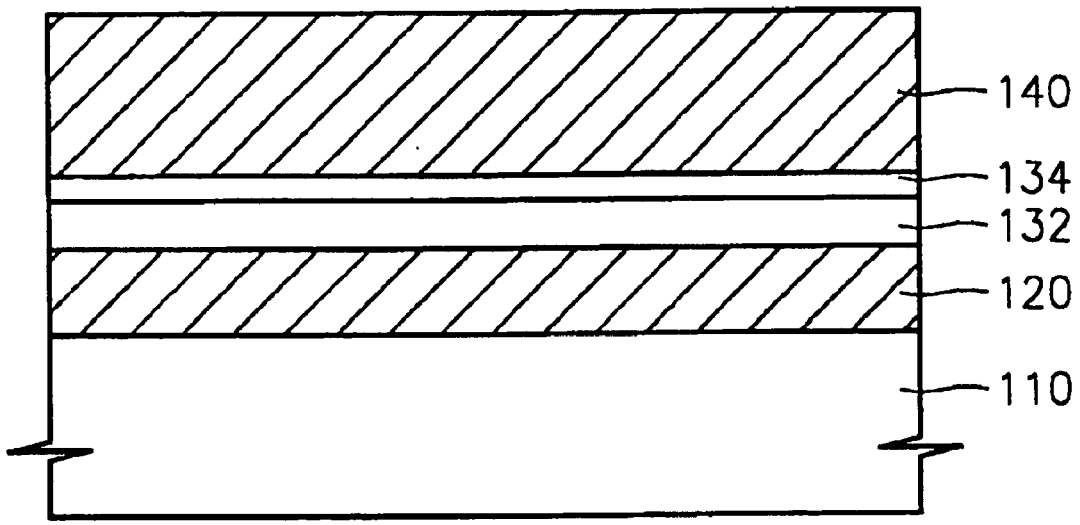

Referring to FIG. 1E, an upper electrode 140 is formed on the $HfO_2$ dielectric layer 134 to a thickness of about 50–2000 Å. The upper electrode 140 is formed of a single layer of polysilicon, a metal nitride, or a noble metal, or a composite layer of these materials. For example, the upper layer 140 may be formed of a single layer of polysilicon, TiN, TaN, WN, Ru, Ir, or Pt, or a composite layer of these materials. Suitable examples of composite layers for the upper electrode 40 include a TiN/polysilicon layer, a TaN/polysilicon layer, a Ru/TiN layer, and the like. The upper electrode 140 may be formed using ALD, CVD, or metal-organic chemical vapor deposition (MOCVD), with MOCVD being more preferred. When the upper electrode 140 is formed using MOCVD, a metal organic material, which contains no Cl atom that is a kind of contamination source, is used as a source metal material.

As described above, a capacitor according to the present invention includes a composite $Al_2O_3/HfO_2$ dielectric layer composed of the $Al_2O_3$ dielectric layer 132 and the $HfO_2$ dielectric layer 134, which has the same or smaller thickness than the $Al_2O_3$ dielectric layer 132. In other words, a thickness ratio of the $Al_2O_3$ dielectric layer 132 to the $HfO_2$ dielectric layer 134 is greater than or equal to 1. The leakage current characteristics of the capacitor are improved by such a composite $Al_2O_3/HfO_2$ dielectric layer structure. By forming the thickness of the $Al_2O_3$ dielectric layer 132 in a range of 30–60 Å, direct tunnelling through the dielectric layer of the capacitor is suppressed and the composite dielectric layer has stable current leakage current characteristics.

Figure 2:
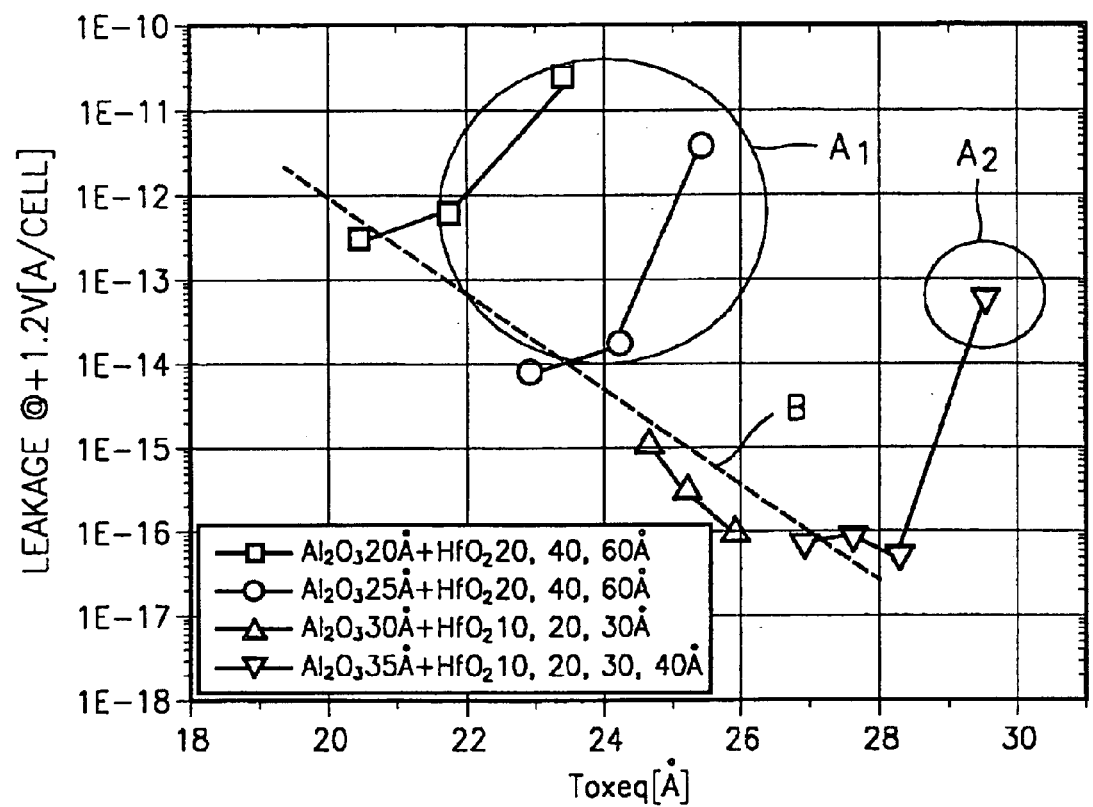
FIG. 2 is a graph of current leakage distribution versus equivalent oxide thickness (Toxeq) for various composite Al$_2$O$_3$/HfO$_2$ dielectric layers having different thickness ratios of the Al$_2$O$_3$ dielectric layer to the HfO$_2$ dielectric layer.

FIG. 2 is a graph of current leakage distribution versus equivalent oxide thickness (Toxeq) for various composite $Al_2O_3/HfO_2$ dielectric layers having different thickness ratios of the $Al_2O_3$ dielectric layer to the $HfO_2$ dielectric layer. In FIG. 2, as is apparent from the circles designated by A1 and A2, leakage current characteristics are deteriorated for composite $Al_2O_3/HfO_2$ dielectric layers whose $Al_2O_3$ dielectric layer is thicker than their $HfO_2$ dielectric layer. Dashed lines designated by B indicate a normal current distribution.

FIG. 3 is a table of leakage current characteristics for capacitors with various composite $Al_2O_3/HfO_2$ dielectric layers having different thickness ratios of the $Al_2O_3$ dielectric layer to the $HfO_2$ dielectric layer. The figures in FIG. 3 indicate the equivalent oxide thickness of each of the sample capacitors. As is apparent from FIG. 3, leakage current deterioration is more serious for capacitors with smaller thickness ratios of the $Al_2O_3$ dielectric layer to the $HfO_2$ dielectric layer.

Figure 4:
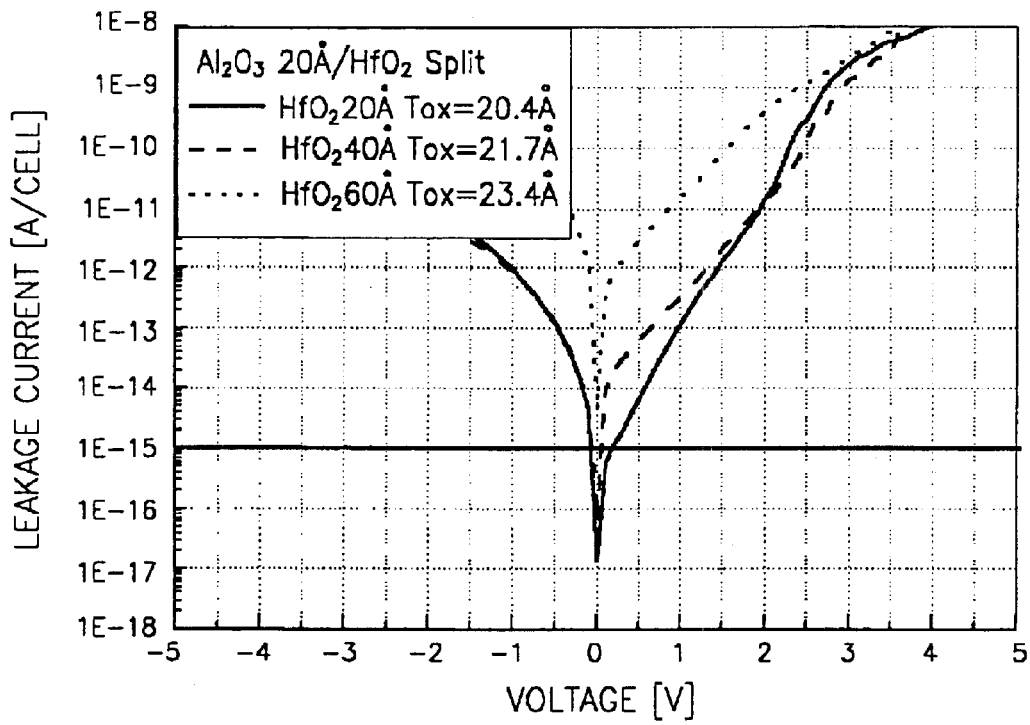
FIG. 4 is a graph of measured leakage current versus thickness of the HfO$_2$ dielectric layer, which is formed on the Al$_2$O$_3$ dielectric layer having a constant thickness, for different capacitors having the composite Al$_2$O$_3$/HfO$_2$ dielectric layer.

FIG. 4 is a graph of measured leakage current versus thickness of the $HfO_2$ dielectric layer, which is formed on the $Al_2O_3$ dielectric layer having a thickness of 20 Å, for different capacitors having the composite $Al_2O_3/HfO_2$ dielectric layer. In FIG. 4, "$T_{ox}$" denotes equivalent oxide thickness.

As is apparent from FIG. 4, when a thickness ratio of the $Al_2O_3$ dielectric layer to the $HfO_2$ dielectric layer is less than 1.0, i.e., when the thickness of the $Al_2O_3$ dielectric layer is smaller than the thickness of $HfO_2$ dielectric layer, leakage current characteristics are deteriorated. When a thickness ratio of the $Al_2O_3$ dielectric layer to the $HfO_2$ dielectric layer is equal to 1.0, i.e., when the $Al_2O_3$ dielectric layer and the $HfO_2$ dielectric layer have the same thickness, leakage current characteristics are favorable.

Figure 5:
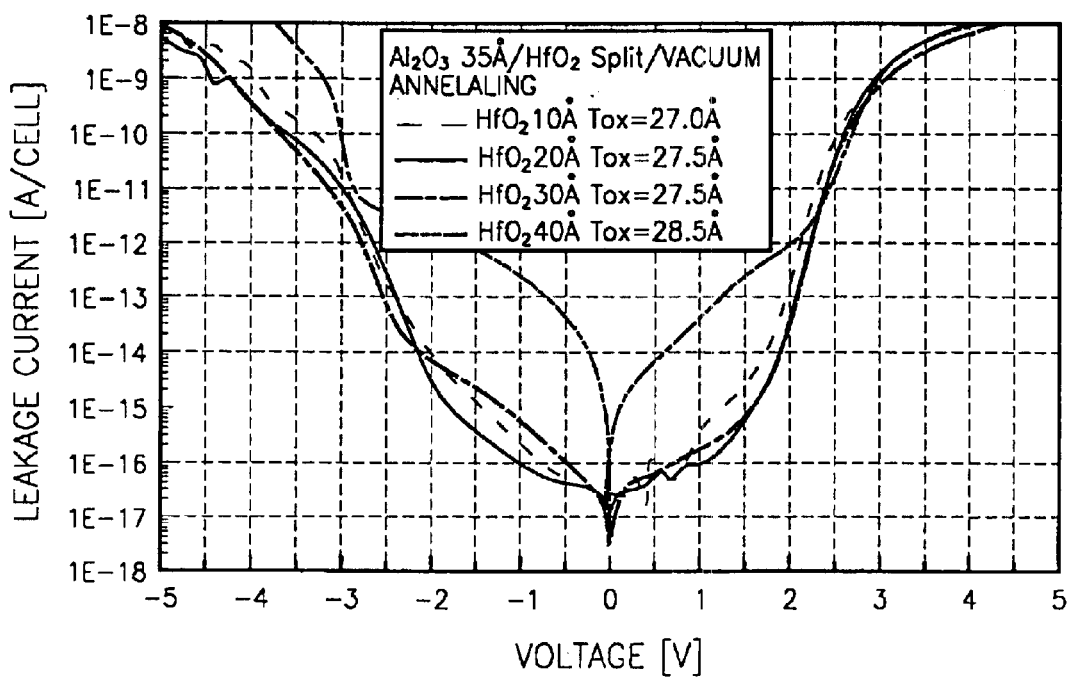
FIG. 5 is a graph of measured leakage current versus thickness of the HfO$_2$ dielectric layer, which is formed on the Al$_2$O$_3$ dielectric layer having a constant thickness, for different capacitors having the composite Al$_2$O$_3$/HfO$_2$ dielectric layer.

FIG. 5 is a graph of measured leakage current versus thickness of the $HfO_2$ dielectric layer, which is formed on the $Al_2O_3$ dielectric layer having a thickness of 35 Å, for different capacitors having the composite $Al_2O_3/HfO_2$ dielectric layer. In FIG. 5, when a thickness ratio of the $Al_2O_3$ dielectric layer to the $HfO_2$ dielectric layer is less than 1.0, the leakage current characteristics are deteriorated. When a thickness ratio of the $Al_2O_3$ dielectric layer to the $HfO_2$ dielectric layer is greater than 1.0, the leakage current characteristics are favorable.

Figure 6:
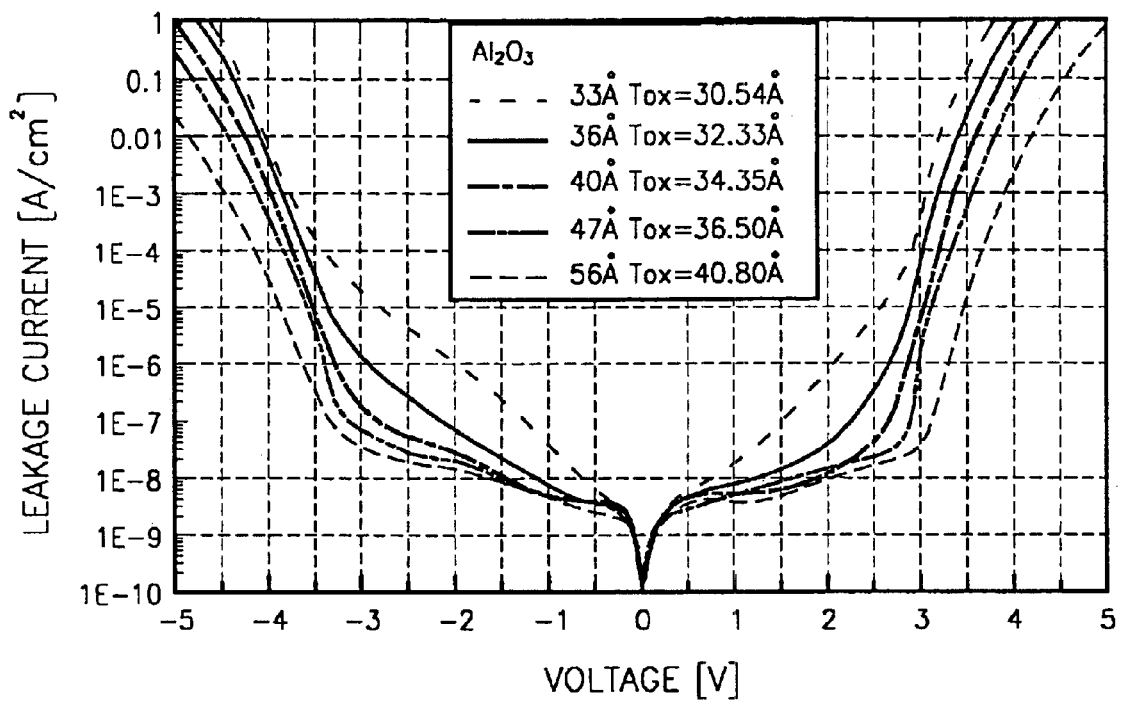
FIG. 6 is a graph of leakage current characteristics of capacitors having a single Al$_2$O$_3$ dielectric layer, which was measured for comparison.

FIG. 6 is a graph of leakage current characteristics of capacitors having a single $Al_2O_3$ dielectric layer, which was measured for comparison. As shown in FIG. 6, as the thickness of the $Al_2O_3$ dielectric layer becomes smaller, the equivalent oxide thickness (Tox) is reduced. The leakage current of the $Al_2O_3$ dielectric layer is abruptly increased at a thickness of 33 Å. From the results of FIG. 6, it is apparent that reducing the thickness of the single $Al_2O_3$ dielectric layer is limited at an equivalent oxide thickness of about 30 Å, in consideration of the leakage current characteristics of the $Al_2O_3$ layer.

Figure 7:
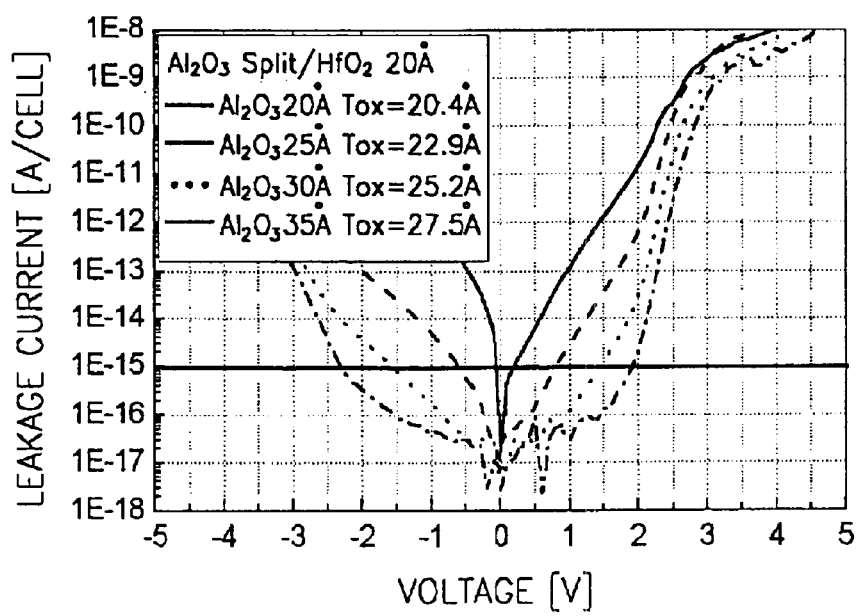
FIG. 7 is a graph of measured leakage current versus thickness of the Al$_2$O$_3$ dielectric layer for different capacitors having the composite Al$_2$O$_3$/HfO$_2$ dielectric layer, which are manufactured by the method according to the present invention and whose HfO$_2$ dielectric layer has a constant thickness.

FIG. 7 is a graph of measured leakage current versus thickness of the $Al_2O_3$ dielectric layer for different capacitors having the composite $Al_2O_3/HfO_2$ dielectric layer, which is manufactured by the method according to the present invention and whose $HfO_2$ dielectric layer has a thickness of 20 Å. In FIG. 7, when the $Al_2O_3$ dielectric layer has a thickness of 20 Å and 25 Å, the leakage current is greatly increased at a low voltage of 2V or less. When the $Al_2O_3$ dielectric layer has a thickness of 30 Å and 35 Å, almost the same leakage current characteristics as when a single $Al_2O_3$ dielectric layer is used appear, despite a small equivalent oxide thickness of the composite $Al_2O_3/HfO_2$ dielectric layer.

Figure 8:
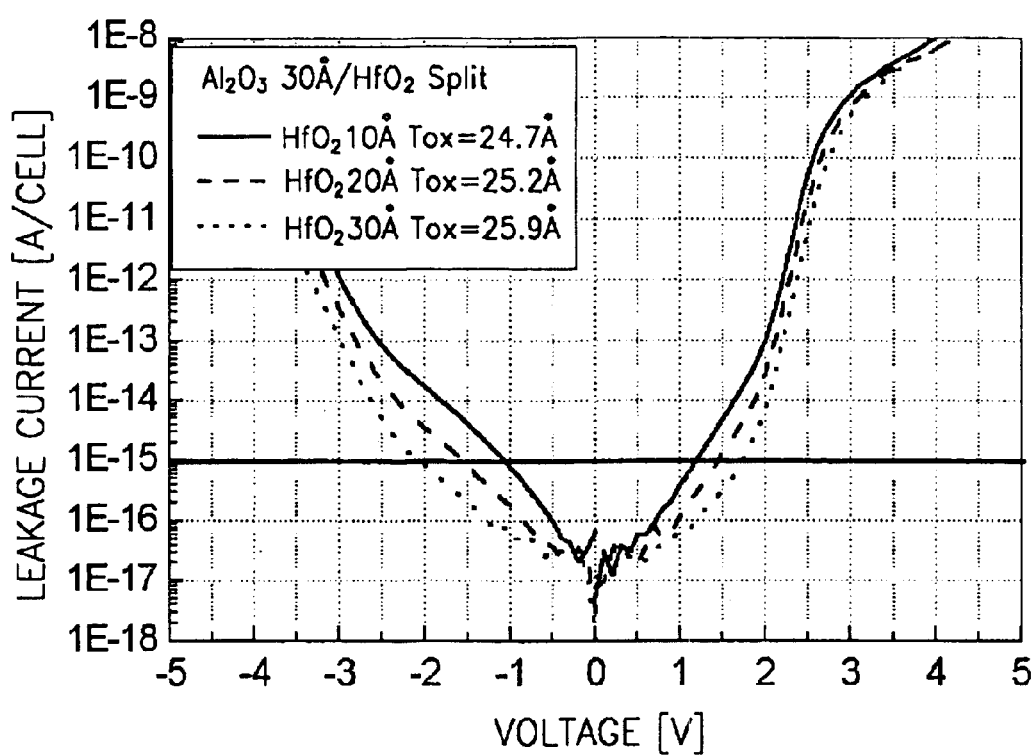
FIG. 8 is a graph of measured leakage current versus thickness of the HfO$_2$ dielectric layer, which is formed on the Al$_2$O$_3$ dielectric layer having a constant thickness, for different capacitors having the composite Al$_2$O$_3$/HfO$_2$ dielectric layer manufactured by the method according to the present invention.

FIG. 8 is a graph of measured leakage current versus thickness of the $HfO_2$ dielectric layer, which is formed on the $Al_2O_3$ dielectric layer having a thickness of 30 Å, for different capacitors having the composite $Al_2O_3HfO_2$ dielectric layer manufactured by the method according to the present invention.

In FIG. 8, as the thickness of the $HfO_2$ dielectric layer is increased, the leakage current is reduced. Although a degree of improvement in leakage current characteristics is small compared to increasing the thickness of the $Al_2O_3$ dielectric layer, as is apparent from FIG. 8, the effect of increasing the thickness of the $HfO_2$ dielectric layer on the equivalent oxide thickness is minor.

As described above, in a capacitor with such a composite $Al_2O_3/HfO_2$ dielectric layer, leakage current characteristics are more dependent on the thickness of the $Al_2O_3$ dielectric layer than on the thickness of the $HfO_2$ dielectric layer. Therefore, to attain stable leakage current characteristics in capacitors with the composite $Al_2O_3/HfO_2$ dielectric layer, it is preferable that the thickness of the $Al_2O_3$ dielectric is 30 Å or greater.

In general, as the deposition thickness of the $HfO_2$ layer increases, more crystallization occurs during the deposition. This effect can be identified using an atomic force microscope (AFM).

Figure 9:
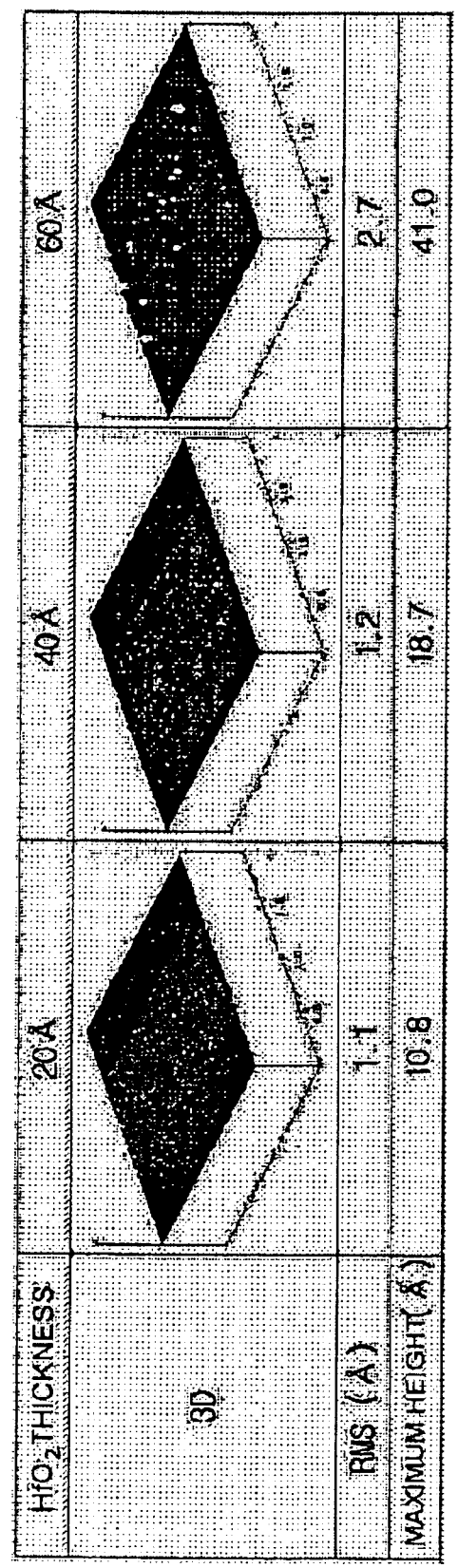
FIG. 9 shows atomic force microscopic (AFM) images with respect to thickness of the HfO$_2$ layer.

FIG. 9 shows AFM images with respect to thickness of the $HfO_2$ layer. As shown in FIG. 9, when the $HfO_2$ layer has a thickness of 60 Å, surface roughness is greatly increased. When the thickness of the $HfO_2$ layer is increased, partial crystallization occurs within the $HfO_2$ layer. Also, the crystallized portion of the $HfO_2$ layer grows more rapidly than an amorphous portion. As is apparent from the AFM images of FIG. 9, when the $HfO_2$ layer has a thickness of 60 Å, the $HfO_2$ layer grows in a needle shape and has rougher surface.

According to the result of an AFM analysis, the $HfO_2$ layer starts to crystallize at a thickness of about 50 Å.

FIG. 1 is a graph of measured leakage current versus thickness of the $HfO_2$ dielectric layer, which is formed on the $Al_2O_3$ dielectric layer having a thickness of 25 Å, for different capacitors having the composite $Al_2O_3/HfO_2$ dielectric layer manufactured by the method according to the present invention.

Figure 10:
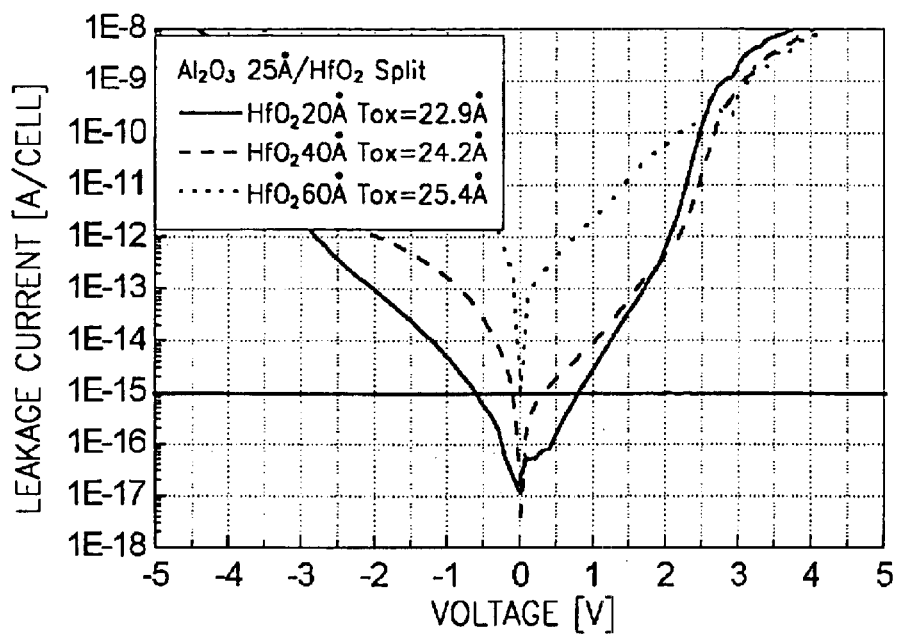
FIG. 10 is a graph of measured leakage current versus thickness of the HfO$_2$ dielectric layer, which is formed on the Al$_2$O$_3$ dielectric layer having a constant thickness, for different capacitors having the composite Al$_2$O$_3$/HfO$_2$ dielectric layer manufactured by the method according to the present invention.

Contrary to the expectation that the thicker $HfO_2$ dielectric layer is, the more the high dielectric layer will improve leakage current characteristics, which is a known advantage of the composite $Al_2O_3/HfO_2$ dielectric layer structure, in FIG. 10, the leakage current characteristics are deteriorated when the thickness of the $HfO_2$ dielectric layer is increased. This result is believed to be related with the crystallization of the $HfO_2$ dielectric layer. In other words, as the thickness of the $HfO_2$ dielectric layer is increased, crystalline $HfO_2$ grains grow. The $HfO_2$ grains grown into the $Al_2O_3$ layer of the composite $Al_2O_3/HfO_2$ dielectric layer structure serve as leakage current paths within the dielectric layer and deteriorate the leakage current characteristic.

As is apparent from the above measurement results, in order to maximize the effect of the $HfO_2$ layer reducing the leakage current in capacitors with such a composite $Al_2O_3/HfO_2$ dielectric layer structure, it is preferable that the thickness of the $HfO_2$ dielectric layer is determined to be smaller than the thickness at which crystallization of the $HfO_2$ layer is initiated, for example, to be about 40 Å or less based on the results of the AFM analysis.

Figure 11:
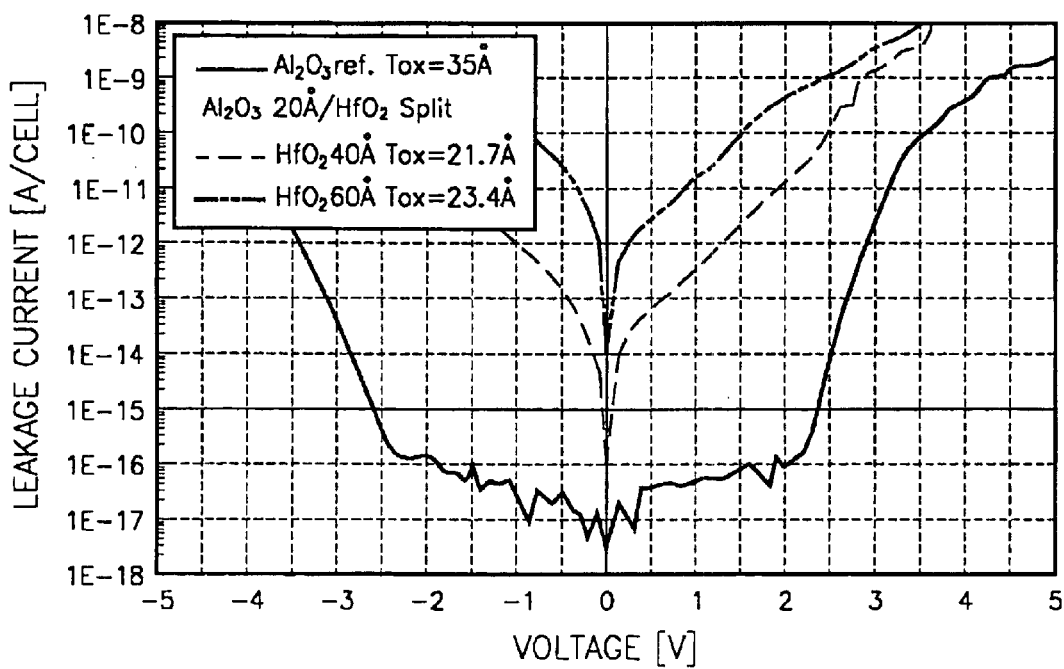
FIGS. 11 and 12 are graphs of measured leakage current for different capacitors with a composite Al$_2$O$_3$/HfO$_2$ dielectric layer when a thickness ratio of Al$_2$O$_3$ to HfO$_2$ is smaller than 1.
Figure 12:
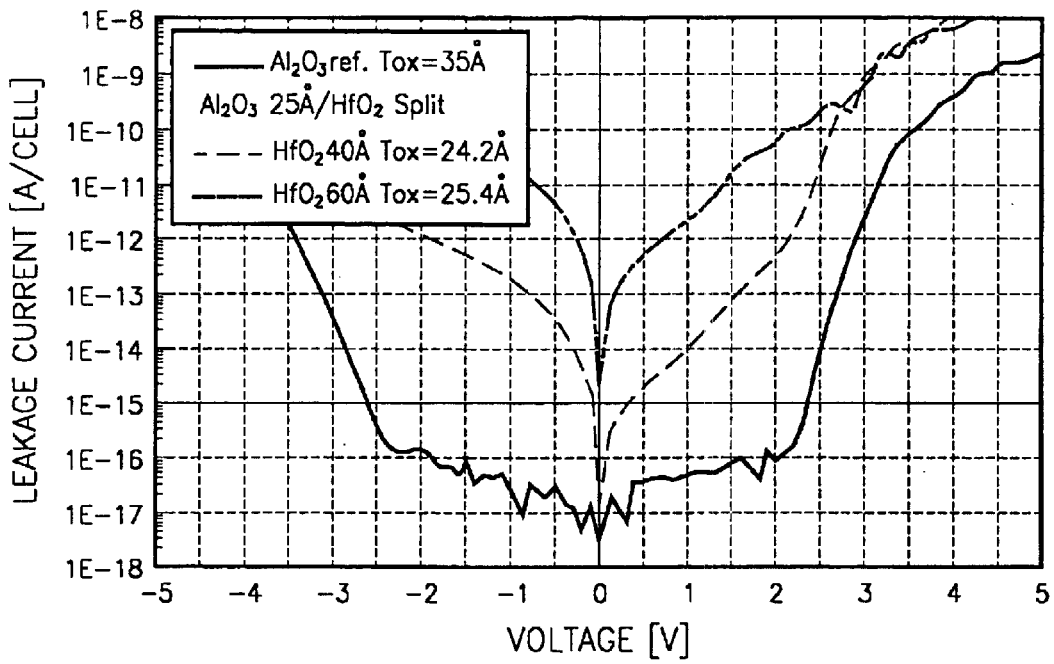

FIGS. 11 and 12 are graphs of measured leakage current versus thickness ratio of the $Al_2O_3$ dielectric layer to the $HfO_2$ dielectric layer, when the thickness ratio is smaller than 1, for different capacitors with the composite $Al_2O_3/HfO_2$ dielectric layer. In FIGS. 11 and 12, the leakage current characteristic of a capacitor with a single $Al_2O_3$ dielectric layer is also shown for comparison.

In particular, FIG. 11 is a graph of measured leakage current for different capacitors with a 20-Å thick. $Al_2O_3$ dielectric layer and an $HfO_2$ dielectric layer having a larger thickness than the $Al_2O_3$ dielectric layer. FIG. 12 is a graph of measured leakage current for different capacitors with a 25-Å thick $Al_2O_3$ dielectric layer and an $HfO_2$ dielectric layer having a larger thickness than the $Al_2O_3$ dielectric layer.

As is apparent from FIGS. 11 and 12, the leakage current characteristics are deteriorated when the thickness ratio of the $Al_2O_3$ dielectric layer to the $HfO_2$ dielectric layer is smaller than 1.

Figure 13:
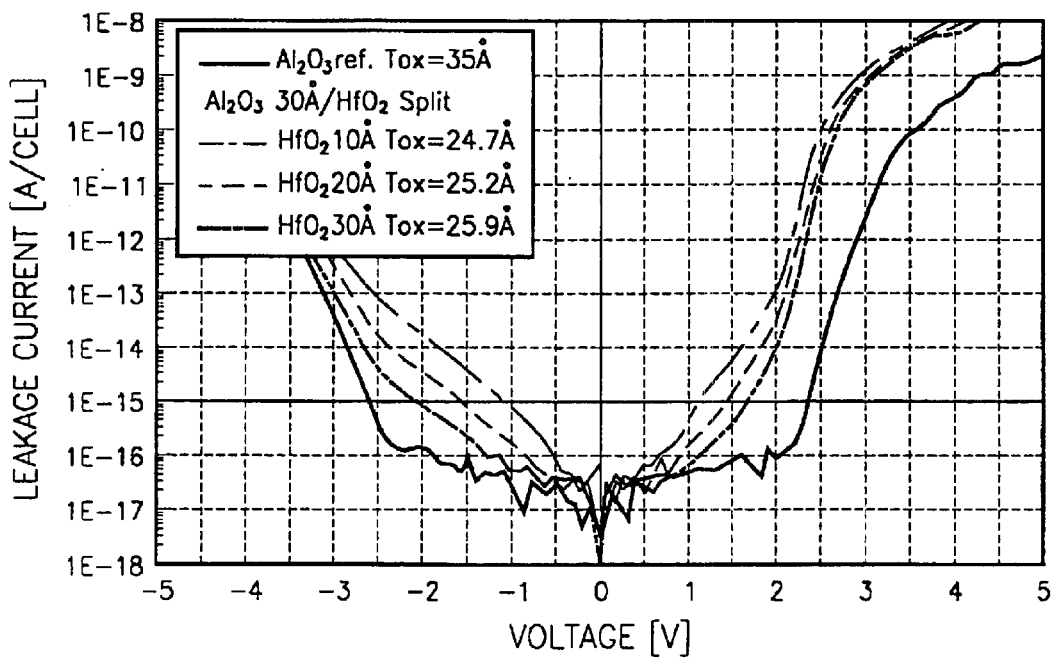
FIGS. 13 and 14 are graphs of measured leakage current for different capacitors with a composite Al$_2$O$_3$/HfO$_2$ dielectric layer when a thickness ratio of Al$_2$O$_3$ to HfO$_2$ is greater than or equal to 1 according to the present invention.
Figure 14:
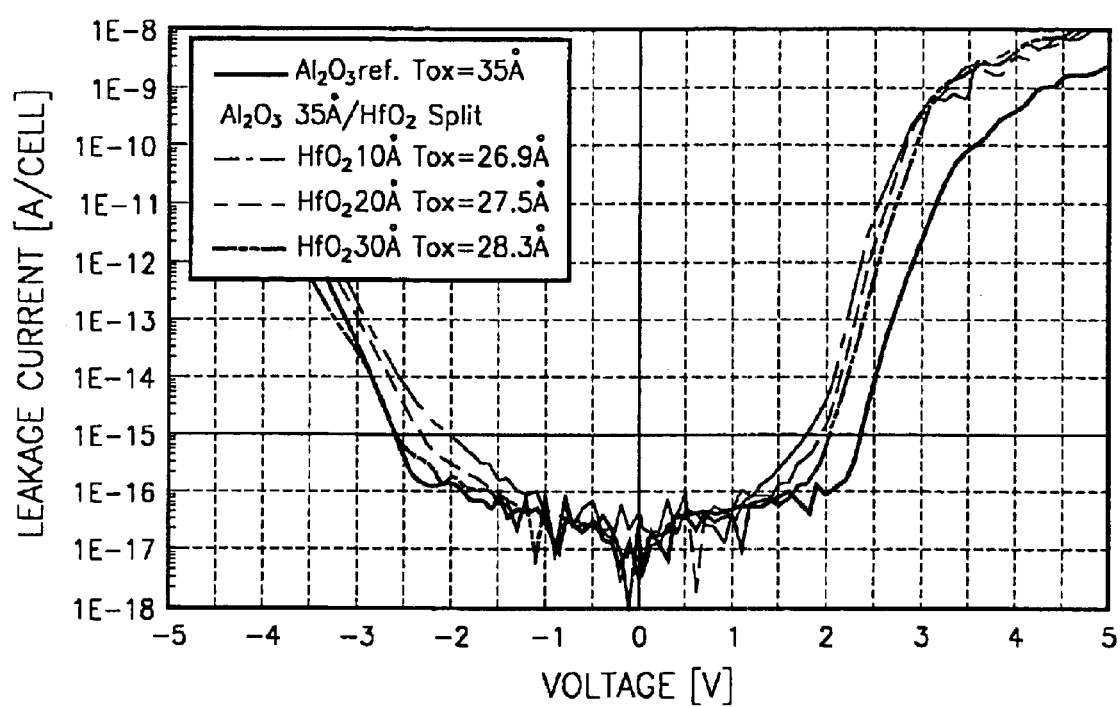

FIGS. 13 and 14 are graphs of leakage current versus thickness ratio of the $Al_2O_3$ dielectric layer to the $HfO_2$ dielectric layer, when the thickness ratio is larger than 1, for different capacitors with the composite $Al_2O_3/HfO_2$ dielectric layer. In FIGS. 13 and 14, the leakage current characteristic of a capacitor with a single $Al_2O_3$ dielectric layer is also shown for comparison.

In particular, FIG. 13 is a graph of measured leakage current for different capacitors with a 30-Å thick $Al_2O_3$ dielectric layer and an $HfO_2$ dielectric layer having a thickness smaller than or equal to the $Al_2O_3$ dielectric layer. FIG. 14 is a graph of measured leakage current for different capacitors with a 35-Å thick $Al_2O_3$ dielectric layer and an $HfO_2$ dielectric layer having a smaller thickness than the $Al_2O_3$ dielectric layer.

As is apparent from FIGS. 13 and 14, the leakage current characteristics are favourable when the thickness ratio of the $Al_2O_3$ dielectric layer to the $HfO_2$ dielectric layer is greater than or equal to 1.

A capacitor of a semiconductor memory device according to the present invention has a composite $Al_2O_3/HfO_2$ dielectric layer, which is composed of an $Al_2O_3$ dielectric layer and an $HfO_2$ dielectric layer, wherein a thickness ratio of the $Al_2O_3$ dielectric layer to the $HfO_2$ dielectric layer is greater than or equal to 1. The leakage current characteristics of capacitors are improved with such a composite $Al_2O_3/HfO_2$ dielectric layer structure. In addition, when the $Al_2O_3$ dielectric layer of the composite $Al_2O_3/HfO_2$ dielectric layer has a thickness of about 30–60 Å, direct tunnelling through the dielectric layer of the capacitor is suppressed and stable leakage current characteristics are obtained. When the $HfO_2$ dielectric layer of the composite $Al_2O_3/HfO_2$ dielectric layer has a thickness of about 40 Å or less, crystallization of the $HfO_2$ dielectric layer and an accompanying increase in leakage current are suppressed.

With the capacitor according to the present invention that includes a composite $Al_2O_3/HfO_2$ dielectric layer with optimal thickness ratio between the two dielectric layers, the effect of suppressing increase in leakage current is maximized and superior electrical properties are obtained.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method of manufacturing a semiconductor memory device, the method comprising:

forming a lower electrode on a semiconductor substrate;

forming a composite dielectric layer on the lower electrode, the composite dielectric layer including an $Al_2O_3$ dielectric layer having a first thickness an $HfO_2$ dielectric layer having a second thickness, the second thickness begin smaller than or equal to the first thickness; and forming an upper electrode on the composite dielectric layer.

2. The method of claim 1, wherein the $Al_2O_3$ dielectric layer is formed using one of chemical vapor deposition and atomic layer deposition.

3. The method of claim 1, wherein the first thickness of the $Al_2O_3$ dielectric layer is in a range of 30–60 Å.

4. The method of claim 1, wherein the $HfO_2$ dielectric layer is formed using one of chemical vapor deposition and atomic layer deposition.

5. The method of claim 1, wherein the second thickness of the $HfO_2$ dielectric layer is smaller than or equal to 40 Å.

6. The method of claim 5, wherein the second thickness of the $HfO_2$ dielectric layer is in a range of 10–40 Å.

7. The method of claim 1, wherein the lower electrode is made of one of polysilicon, metal nitride, and noble metal.

8. The method of claim 7, wherein the lower electrode is made of one selected from the group consisting of TiN, TaN, WN, Ru, Ir, Pt, and a composite layer of the forgoing materials.

9. The method of claim 1, wherein the upper electrode is made of one of polysilicon, metal nitride, and noble metal.

10. A method of claim 9, wherein the upper electrode is made of one selected from the group consisting of TiN, TaN, WN, Ru, Ir, Pt, an a composite layer of the forgoing materials.

11. The method of claim 1, further comprising thermally treating the composite dielectric layer.

12. The method of claim 11, wherein thermally treating the composite dielectric layer is perform in a vacuum, in an oxygen atmosphere, in an inert gas atmosphere by rapid thermal annealing, by furnace annealing, plasma annealing, or UV annealing.

* * * * *

UNITED STATES PATENT AND TRADEMARK OFFICE
CERTIFICATE OF CORRECTION

PATENT NO.         : 6,897,106 B2
APPLICATION NO. : 10/713577
DATED              : May 24, 2005
INVENTOR(S)        : Park et al.

It is certified that error appears in the above-identified patent and that said Letters Patent is hereby corrected as shown below:

At column 7, line 10, please replace "$Al_2O_3HFO_2$" with -- $Al_2O_3/HFO_2$ --
At column 7, line 44, please replace "FIG. 1" with --FIG. 10--
At column 8, line 12, please replace "thick. $Al_2O_3$" --thick $Al_2O_3$--
At column 9, line 11, pleae replace "thickness begin smaller" with --thickness being smaller--
At column 10, line 14, please replace "Pt, an a" with --Pt, and a--

Signed and Sealed this

Twelfth Day of December, 2006

JON W. DUDAS
*Director of the United States Patent and Trademark Office*